(12) United States Patent
West

(10) Patent No.: US 10,673,148 B1
(45) Date of Patent: Jun. 2, 2020

(54) CIRCULARLY SYMMETRIC TIGHTLY COUPLED DIPOLE ARRAY WITH NON-COINCIDENT PHASE CENTER

(71) Applicant: Rockwell Collins, Inc., Cedar Rapids, IA (US)

(72) Inventor: James B. West, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 48 days.

(21) Appl. No.: 16/147,252

(22) Filed: Sep. 28, 2018

(51) Int. Cl.
| | | |
|---|---|---|
| H01Q 21/06 | (2006.01) |
| H01Q 9/28 | (2006.01) |
| H01Q 21/20 | (2006.01) |
| H05K 1/02 | (2006.01) |
| H05K 1/14 | (2006.01) |
| H01Q 21/24 | (2006.01) |

(52) U.S. Cl.
CPC .......... *H01Q 21/062* (2013.01); *H01Q 9/285* (2013.01); *H01Q 21/20* (2013.01); *H01Q 21/245* (2013.01); *H05K 1/0243* (2013.01); *H05K 1/142* (2013.01); *H05K 2201/10098* (2013.01)

(58) Field of Classification Search
CPC ...... H01Q 21/062; H01Q 9/285; H01Q 21/20; H01Q 21/245
See application file for complete search history.

(56) References Cited

U.S. PATENT DOCUMENTS

2017/0338558 A1    11/2017  West

OTHER PUBLICATIONS

U.S. Appl. No. 15/825,711, filed Nov. 29, 2017, West et al.
U.S. Appl. No. 15/970,781, filed May 3, 2018, West et al.
U.S. Appl. No. 15/972,608, filed May 7, 2018, West et al.
U.S. Appl. No. 16/021,784, filed Jun. 28, 2018, Paulsen et al.
U.S. Appl. No. 16/103,742, filed Aug. 14, 2018, West et al.
U.S. Appl. No. 16/123,854, filed Sep. 6, 2018, West et al.

*Primary Examiner* — Graham P Smith
(74) *Attorney, Agent, or Firm* — Donna P. Suchy

(57) ABSTRACT

An antenna array includes a printed circuit board including printed circuit board elements circumferentially disposed at locations on a surface of the printed circuit board. The printed circuit board elements are disposed in opposing pairs at diametrically opposite locations and include a first member and a second member. The first member intersects the second member which is curved. The antenna array can be an ultra-ultra wide band (UUWB) wavelength scaled array (WSA) tightly coupled dipole array (TCDA) active electronically scanned array (AESA) aperture.

20 Claims, 5 Drawing Sheets

US 10,673,148 B1

CIRCULARLY SYMMETRIC TIGHTLY COUPLED DIPOLE ARRAY WITH NON-COINCIDENT PHASE CENTER

BACKGROUND

Embodiments of inventive concepts disclosed herein relate generally to antenna arrays including but not limited to a tightly coupled dipole array (TCDA).

Modern sensing and communication systems may utilize various types of antennas to provide a variety of functions, such as communication, radar, and sensing functions. For example, ultra-high frequency (UHF) and very high frequency (VHF) radio systems use directional and omnidirectional antenna arrays for data and voice communication. In another example, radar systems use antenna arrays to perform functions including but not limited to: sensing, intelligence gathering (e.g., signals intelligence, or SIGINT), direction finding (DF), electronic countermeasure (ECM) or self-protection (ESP), electronic support (ES), electronic attack (EA) and the like. An ultra-ultra wide band (UUWB) Wavelength Scaled Array (WSA) TCDA Active Electronically Scanned Array (AESA) Aperture that has rotationally symmetric radiation properties in the far field radiating is difficult to achieve with conventional manufacturing techniques.

SUMMARY

In one aspect, embodiments of the inventive concepts disclosed herein are directed to an antenna array. The antenna array includes a substrate having a surface and first members and second members. The second members are arranged about a first circumference about a center point on the surface of the substrate. The first members extend radially with respect to the center point, and the second members are curved. The antenna array also includes third members and further members. The fourth members are arranged about a second circumference about the center point on the surface of the substrate. The first circumference is smaller than the second circumference. The third members extend radially with respect to the center point, and the fourth members are curved.

In a further aspect, embodiments of the inventive concepts disclosed herein are directed to an antenna system. The antenna system includes a printed circuit board including printed circuit board elements including first arched elements circumferentially disposed on a surface of the printed circuit board at diametrically opposite locations and second linear elements disposed radially at diametrically opposite locations. The antenna system further includes a polarization synthesis network coupled to the printed circuit board elements. The polarization synthesis network is configured to compensate for non-orthogonal polarization associated with a pair comprising one of the first arched elements and one of the linear elements.

In a further aspect, embodiments of the inventive concepts disclosed herein are directed to a method. The method includes providing a substrate, providing at least four first elements at locations along a circumference on the substrate, and providing at least four second elements radially with respect to the circumference. The first elements are curved, and the second elements are linear. The elements are disposed such that a pair of a first element of the first elements and a second element of the second elements effectively have non-orthogonal linear polarization due to parasitic cross polarization cancellation. The method also includes providing a polarization synthesis network coupled to the pair to provide arbitrary polarization.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or maybe represented schematically in the interest of clarity. Like reference numerals in the drawings may represent and refer to the same or similar element, feature, or function. In the drawings.

DETAILED DESCRIPTION

Figure 1:
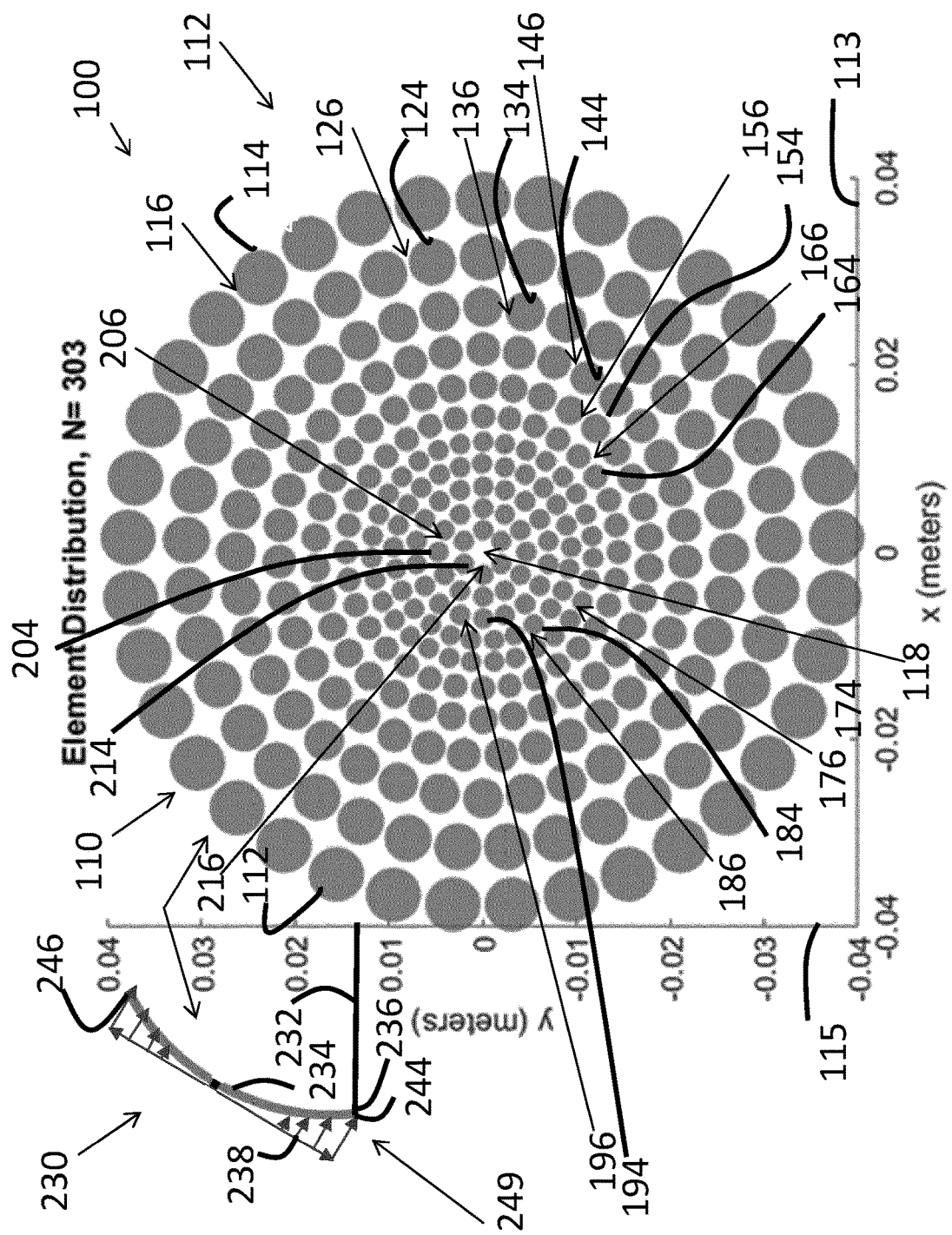
FIG. 1 is a top view schematic drawing of an antenna array according to exemplary aspects of the inventive concepts disclosed herein.

Before describing in detail embodiments of the inventive concepts disclosed herein, it should be observed that the inventive concepts disclosed herein include, but are not limited to a novel structural combination of components and circuits disclosed herein, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Some embodiments of the inventive concepts disclosed herein are directed to an aperture (e.g., a UUWB WSA TCDA AESA aperture) that has dual polarized rotationally symmetric radiation properties in the far field radiating zone (e.g. beam width, gain, etc.). In some embodiments, the rotationally symmetric radiation properties of a directional antenna achieves advantages for RF sensor systems, such as a radar or other sensor. The UUWB aperture implementation realizes near constant radiation properties over very large bandwidths (e.g., greater than 10:1 instantaneous bandwidth (IBW)) in some embodiments. In some embodiments, the array provides UUWB performance for multifunction radio frequency (MFRF) type applications with high polarization purity. In some embodiments, the AESA array is utilized in UUWB signal intelligence (SIGINT) receiver systems (e.g., photonic, RF over optical radio) and/or other advanced radio and radar systems. In some embodiments, the systems and methods provide new wideband system array layout schemes for AESA technology.

In some embodiments, the aperture is provided in a configuration (e.g., with subarrays with uninterrupted element lattice spacing) that can be more easily manufactured. In some embodiments, the aperture is provided in a configuration (e.g., with subarrays with uninterrupted element lattice spacing implementation) that can be provided using tiles including antenna elements that are joined together. In some embodiments, the aperture is provided in a planar and/or conformal WSA UUWB TCDA aperture topology with non-coincident phase centers. The manufacturing techniques, devices and configurations described in U.S. patent application Ser. No. 15/970,781, filed May 3, 2018, "Systems and Methods for Wavelength Scaled Array Layout Optimization, U.S. patent application Ser. No. 15/825,711, filed Nov. 29, 2017, "Polarization Control For Electronically Scanned Arrays," U.S. patent application Ser. No. 16/021, 784, filed Jun. 28, 2018, "Circularly Symmetric Tightly Coupled Dipole Array," U.S. patent application Ser. No. 15/972,608, filed May 7, 2018, and U.S. patent application Ser. No. 15/160,959, filed May 20, 2016 can be utilized in some embodiments; each of the above listed applications is incorporated herein by reference in its entirety and assigned to the assignee of the present application.

Referring to FIG. 1, an antenna system 100 for a communication, radar, or sensing system includes an antenna array 110 (e.g., a circularly shaped ESA array) of antenna elements 112. The antenna array 110 is provided on a substrate, such as, a printed circuit board substrate or other structure in some embodiments. In some embodiments, the antenna array 110 is disposed on multiple circuit boards, such as according to the subarray architecture described in U.S. application Ser. No. 16/103,742 filed Aug. 14, 2018, and U.S. application Ser. No. 16/123,854 filed Sep. 6, 2018, both incorporated herein by reference in their entireties. In some embodiments, the antenna system 100 is for a sensing radar system or electronic warfare radar system (e.g., UUWB signal intelligence (SIGINT) receiver systems such as photonic RF over optical radio systems).

In some embodiments, the antenna system 100 is a UUWB WSA TCDA AESA aperture. The antenna array 110 is shown on a Cartesian plane including an X-axis 113 and a Y-axis 115. The X-axis 113 extends from a negative meter position to a positive meter position, and the Y-axis 115 extends from a negative meter position to a positive meter position. Although particular sizes are shown for the array 110 in FIG. 1, the sizes and dimensions are exemplary and other sizes and dimensions can be used depending upon system criteria and operational parameters. In some embodiments, the antenna array can have an X-axis 113 that extends from a negative 0.4 meter position to a positive 0.4 meter position, and a Y-axis 115 that extends from a negative 0.4 meter position to a positive 0.4 meter position. In some embodiments, the antenna array can have an X-axis 113 that extends from a negative 0.9 meter position to a positive 0.9 meter position, and a Y-axis 115 that extends from a negative 0.9 meter position to a positive 0.9 meter position.

As shown in FIG. 1, the antenna array 110 is formed of circumferentially disposed antenna elements 112 about a center 118. The antenna elements 112 include first elements 114 disposed at a first distance 116 from the center 118 along a circumference, second elements 124 disposed at a second distance 126 from the center 118 along the circumference, third elements 134 disposed at a first distance 136 from the center 118 along a circumference, fourth elements 144 disposed at a fourth distance 146 from the center 118 along the circumference, fifth elements 154 disposed at a fifth distance 156 from the center 118 along the circumference, sixth elements 164 disposed at a sixth distance 166 from the center 118 along the circumference, seventh elements 174 disposed at a seventh distance 176 from the center 118 along the circumference, eighth elements 184 disposed at an eight distance 186 from the center 118 along the circumference, ninth elements 194 disposed at a ninth distance 196 from the center 118 along the circumference, tenth elements 204 disposed at a tenth distance 206 from the center 118 along the circumference, and eleventh elements 214 disposed at an eleventh distance 216 from the center 118 along the circumference. Although eleven sets of the antenna elements 112 are shown in FIG. 1, other numbers of circumferential sets of antenna elements 112 can be utilized.

As shown in FIG. 1, the distance between neighboring elements 114, 124, 134, 144, 154,164, 174, 184, 194, 204, and 214 decreases the closer the element is to the center 118 in some embodiments. The elements 114, 124, 134, 144, 154, 164,174, 184, 194, 204, and 214 are smaller in area (e.g., effective area) the closer the element is to the center 118 in some embodiments. Such a configuration of spacing and element sizes provides for the dense pattern of the antenna elements 112 in some embodiments. The number of the elements 114, 124, 134, 144, 154, 164, 174, 184, 194, 204, and 214 at the respective distances 116, 126, 136, 146, 156, 166, 176, 186, 196, 206, and 216 can be any number from 4 to N where N is an integer in some embodiments. The number of the elements 114, 124, 134, 144, 154, 164, 174, 184, 194, 204, and 214 at the respective distances 116, 126, 136, 146, 156, 166, 176, 186, 196, 206, and 216 can be different from each other in some embodiments. The total number of elements (e.g., 303 in as shown in FIG. 1) varies according to system criteria and operational parameters.

The layout for antenna elements 112 is provided as a wavelength scaled array (WSA) (e.g., a continuously scaled circular WSA aperture) in some embodiments. The layout can be optimized with respect to size as the antenna elements 112 are provided more densely near the center at 118 in some embodiments. In addition, the spacing between the antenna elements 112 associated with the layout can be changed to provide maximum density in some embodiments in some embodiments. A wavelength scale parameter can define the pattern for the array 110 and is indicative of a wavelength scale factor (e.g., a lattice relaxation factor) indicating relaxation of antenna spacing (or relaxation of antenna spacing constraints) in some embodiments. In some embodiments, the antenna elements 112 near the center 118 are configured for higher frequency radio frequency signals and the antenna elements 112 farther from the center 118 are configured for lower frequency RF signals. In some embodiments, the antenna elements 112 in the centermost region of the array 110 are configured to cover the entire operational bandwidth, the antenna elements 112 in the region next tom the centermost region are configured to operate in a sub band below the highest portion and above the lowest portion of the operational bandwidth, and the antenna elements 112 at the periphery are configured to operate at the lower portion of the operational bandwidth. The wavelength scale parameter can indicate a density of the antennas of each band of the antenna system 100 as a function of position. For example, at least two adjacent antenna elements 112 of a first band can be spaced from one another by a first value of the wavelength scale factor, where the first value corresponds to the second frequency. Similarly, at least two adjacent antenna elements 112 of a second band can be spaced from one another by a second value of the wavelength scale parameter, where the second value corresponds to the third frequency. As illustrated in the various electronically scanned arrays described herein, including the antenna system 100, the spacing within bands can change in value from relatively inward bands to relatively outward bands. In some embodiments, the antenna elements 112 of each band have a half-wavelength spacing (e.g., the spacing amongst the antenna elements 112 of the first band is a half-wavelength, where the wavelength corresponds to the first frequency i.e. wavelength=c/first frequency, where c=speed of light).

The values of the wavelength scale parameter can correspond to the positions of the antenna elements 112 along with the frequency of the band. In a Cartesian coordinate system, the value of the wavelength scale parameter can be a function of frequency, element excitation, and/or element delay (or phase) for a particular antenna element 112 and can be a function of x, y, and frequency, where the antenna system 100 is configured as a planar array, and x- and y-refer to Cartesian coordinate dimensions. In a three-dimensional coordinate system, such as where the antenna system 100 is configured as a three-dimensional array—such as a conformal array configured to conform to a three-dimensional surface of an airborne platform or other platform—the value of the wavelength scale parameter can be a function of x, y, z, and frequency (or may be similarly determined in spherical or cylindrical coordinates as appropriate to the application). The wavelength scale parameter can be used to define a position of each antenna element 112 relative to a reference point, such as the center 118 of the antenna system 100, or a peripheral point. The wave length scale parameter can be calculated and the corresponding pattern can be provided according to the principles of U.S. patent application Ser. No. 15/970,781, filed by West et al. on May 3, 2018, and U.S. patent application Ser. No. 16/021,784, filed Jun. 28, 2018, "Circularly Symmetric Tightly Coupled Dipole Array", incorporated herein by reference in their entireties.

In some embodiments, the antenna elements 112 are arranged in concentric circles. Other elements and element patterns are appropriate for a circularly symmetric WSA. In some embodiments, the elements 112 are arranged as multi-arm reactively load spirals. In some embodiments, the antenna elements 112 are cross bowtie dipoles which are end chambered to fit around a given circumference. In some embodiments, the antenna elements 112 are any radiating element that intrinsically creates circular polarizations, for example, micro-strip patches or open ended quad ridged waveguides.

An antenna element 230 of appropriate size is used as each of the antenna elements 112 (e.g., elements 114, 124, 134, 144, 154, 164, 174, 184, 194, 204, and 214) in some embodiments. The element 230 can be configured as an arched dual linear dipole (ADLD) radiating element in some embodiments. The element 230 includes a first dipole element 232 and a second dipole element 234. The dipole element 232 is provided in a straight linear configuration, and the dipole element 234 is provided in a curved configuration in some embodiments. The dipole element 234 is provided along a circumference while the dipole element 232 is provided in a radial fashion with respect to the center 118 of the array 110 in some embodiments.

The antenna element 230 is provided on a printed circuit board in some embodiments. The dipole elements 232 and 234 are printed circuit board trace conductors in some embodiments. The antenna element 230 is provided using metal cutouts or other conductive structures in some embodiments. In some embodiments, the antenna element 230 is a slot type radiators or spiral type radiator. In some embodiments, the antenna elements 112 are provided on a single circuit board or on multiple circuit boards (e.g., tiles) that are joined together to form the antenna array 110. In some embodiments, radially opposed symmetric ADLD element pairs can be generalized to other radiating element types.

The dipole elements 232 and 234 intersect or cross over each other at an end 236 at a 90 degree angle (e.g., a tangent line of dipole element 234 at the end 236 is perpendicular to the dipole element 232) in some embodiments. The dipole element 234 is provided on a first layer of a circuit board and the dipole element 232 is provided on a second layer of the circuit board in some embodiments. In some embodiments, the dipole elements 232 and 234 intersect on a single layer of the circuit board. In some embodiments, the dipole element 234 is provided on the same circuit board level as the dipole element 232 but does not connect to the dipole element 232.

In some embodiments, a capacitive region 249 is between the end 236 of the dipole element 232 and an end 244 of the dipole element 234. The capacitive region 249 can include conductors associated with the elements 232 and 234 in an interdigitated configuration or printed circuit board structure in some embodiments. A dipole element similar to the dipole element 234 is disposed at or near an end 246 of the dipole element 234, and a dipole element similar to the dipole element 232 is disposed at or near the end 246.

The dipole element 234 is provided at a radius of curvature and is curved inwardly towards the center 118 in some embodiments. The distance from the dipole element 234 at the end 244 to the tangent line 238 is greater than the distance between the tangent line 238 at the midpoint and the dipole element 234 and the same as the distance between the tangent line 238 and the end 246 of the dipole element 234 (as shown by vectors) in some embodiments. In some embodiments, radius of curvature is the same as the radius of curvature of the circumference upon which the dipole element 232 is provided. In some embodiments, the radius of curvature is greater than or less than the radius of curvature of the circumference upon which the dipole element 232 is provided.

Figure 2:
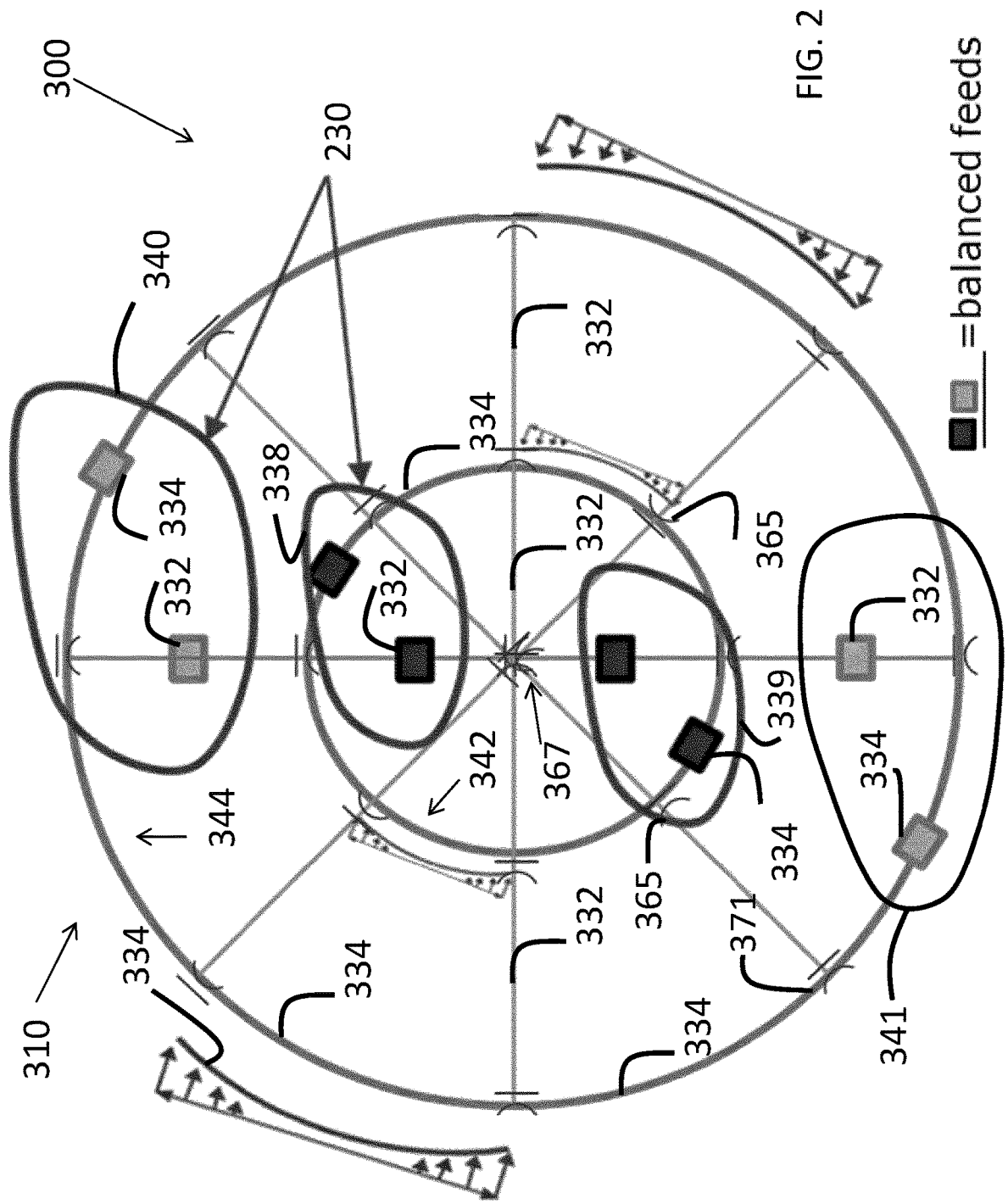
FIG. 2 is a top view schematic drawing of an antenna array with capacitive coupled elements according to exemplary aspects of the inventive concepts disclosed herein.

With reference to FIG. 2, an antenna system 300 includes an array 310 which is similar to the antenna array 110 (FIG. 1). The antenna system 300 includes arched radiating elements 334 similar to the dipole element 234 (FIG. 1). The arched radiating elements 334 are provided at different circumferences 342 and 344. The antenna array 310 also includes linear radiating antenna elements 332 similar to the dipole elements 232. The dipole elements 332 are radially disposed while the dipole elements 334 is bent or curved about a constant radius and disposed along one of the circumferences 342 and 344. The constant radius is the radius of the circumferences 342 and 344 in which the dipole element 334 is disposed in some embodiments. The radiating elements 332 and 334 are disposed in a WSA arrangement with growth from the center of the array 310 and have balanced feeds in some embodiments.

The radiating antenna elements 332 and 334 provide a cross-linear dipole (e.g., element 230) that is distorted to fit within the circular configuration of the antenna array 310. In isolation, each pair of the radiating antenna elements 332 and 334 does not have pure dual orthogonal (DOLP) polarization. However, the array 310 advantageously utilizes parasitic cross-polarization cancellation properties to achieve dual orthogonal linear polarization for the entire array 310 in some embodiments. The cross polarization of diametrically opposed elements 334 (e.g., dipoles) cross cancels to realize pure linear polarization (although rotated) in some embodiments. The elements 332 have pure linear polarization (although rotated) in some embodiments. The resulting dipole pair characteristics of a pair of the elements 332 and 334 have a characteristic that is not orthogonal, phase coincident, and not necessarily the same resonant frequency in some embodiments. The techniques discussed below are utilized to provide an orthogonal characteristic, a phase coincident characteristic, and/or same resonant frequency.

The pairs 338 and 339 of the radiating antenna elements 332 and 334 are provided sequentially and rotated about the circumference 342 as opposing pairs in some embodiments. The pairs 340 and 341 of the radiating antenna elements 332 and 334 are provided sequentially and rotated about the circumference 344 as opposing pairs in some embodiments. The pairs 338 and 339 and the pairs 340 and 341 are 180° apart on the circumferences 342 and 344, respectively, in some embodiments.

The radiating antenna elements 332 are capacitively coupled to the four neighboring radiation antenna elements 332 as represented by the capacitor schematic symbols 365 in FIG. 2. Capacitive coupling occurs between the neighboring radiating antenna elements 332 in different circumferences 342 and 344 and between the neighboring radiating antenna elements 332 in different radial positions in some embodiments. The array 110 is also has similarly capacitively coupled elements 112 (FIG. 1) in some embodiments.

Figure 3:
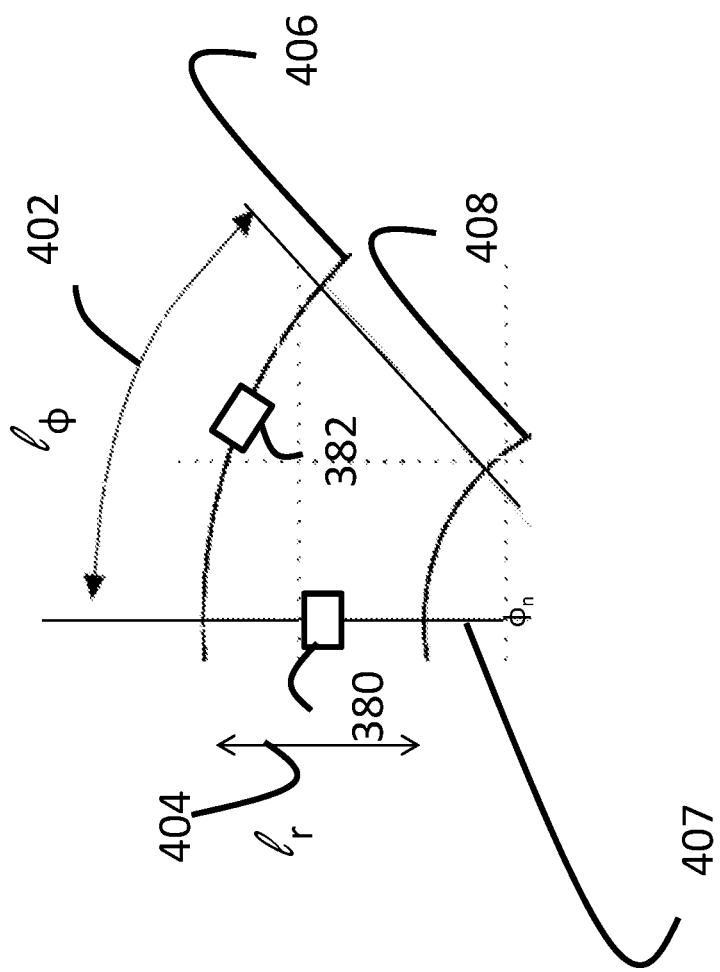
FIG. 3 is a top view schematic drawing of a pair of antenna elements for the antenna arrays illustrated in FIGS. 1 and 2 according to exemplary aspects of the inventive concepts disclosed herein.

With reference to FIG. 3, antenna elements 380 and 382 can be used as the antenna elements 112 (FIG. 1) or as the respective elements 332 and 334 in some embodiments. The antenna element 382 is an arched dipole element, and the antenna element 380 is a linear dipole element. The element 380 is provided on a radial axis 407 and has a length 404. The length 404 is between a circumference 406 and a circumference 408. The circumference 408 is for elements similar to the elements 382 sized for the location on the array 110 (FIG. 1) or 310 (FIG. 2) The element 382 is provided on a circumference 406 and has a length 402. The length 402 is equal to the arc length which is equal to $2\pi R/360/deltaphi$ where R is the radius of the circumference 406 and deltaphi is the angle range covered by the element 382. In some embodiments, the length 402 and 404 are set equal to each other and set according to a resonance frequency for the dipole elements corresponding to the position in the array 110 (FIG. 1) or 310 (FIG. 2).

Similar values for the capacitive coupling combined with a similar length for the lengths 402 and 404 provides a similar resonant frequency in some embodiments. In some embodiments, the arch lengths (e.g., the length 402) of the elements 382 is adjusted to the length 404 of the elements 380 while maintaining WSA unit cell growth (as dictated by the wavelength scale factor) in some embodiments. In some embodiments, the capacitive coupling for the elements 380 and the elements 382 is adjusted to achieve the same resonance frequency. Capacitors or coupling capacitance associated the element 380 and the element 382 are different to compensate different lengths 404 and 402 in some embodiments.

Figure 4:
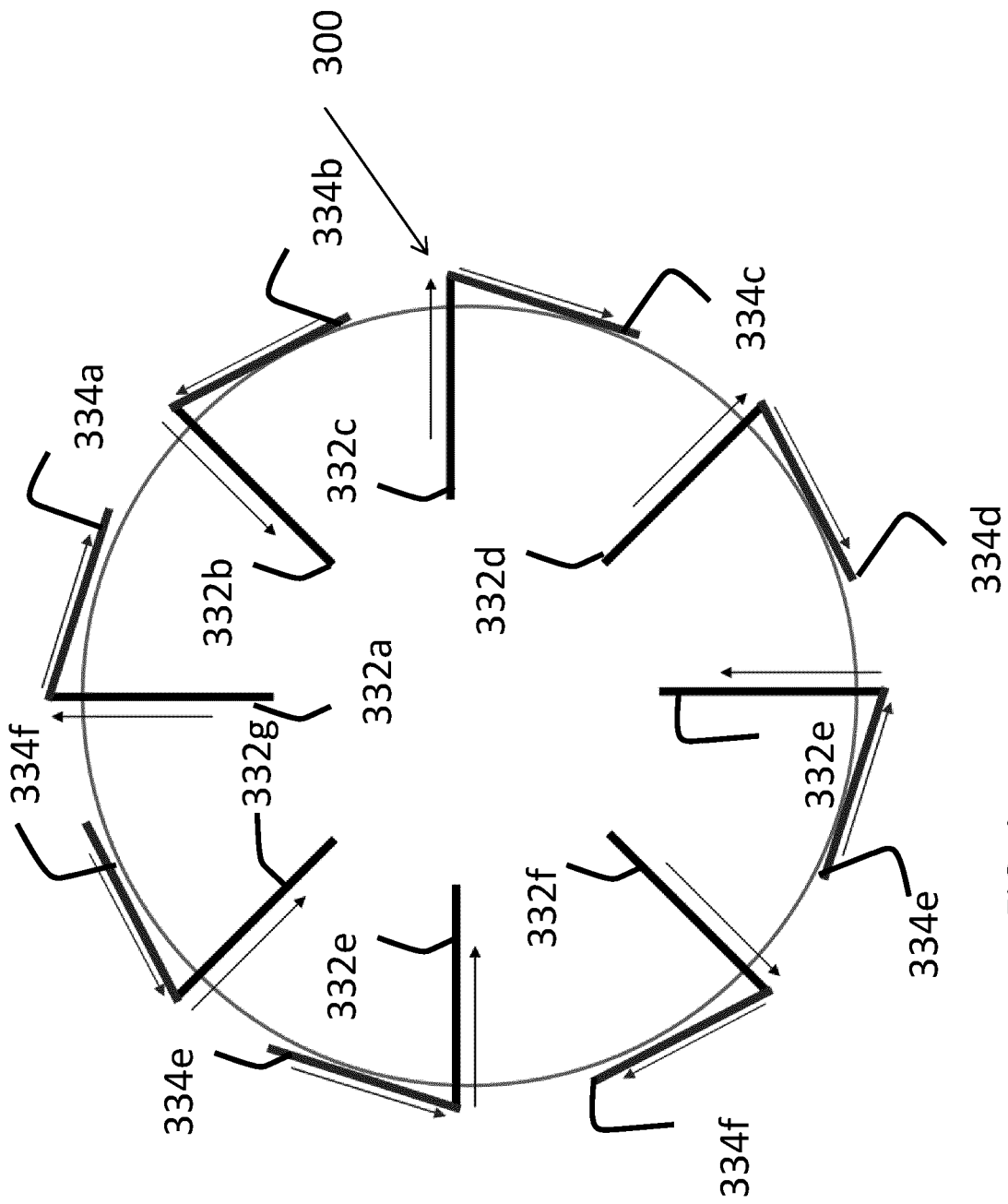
FIG. 4 is a top view schematic drawing of eight pairs of antenna elements for the antenna arrays illustrated in FIGS. 1 and 2 according to exemplary aspects of the inventive concepts disclosed herein.

With reference to FIG. 4, pairs of the antenna elements 332 and 334 are represented electrically as pairs of antenna elements 332a-h and 334a-h. The parasitic polarization components for the pairs of the antenna elements 332a-h and 334a-h are diametrically opposed so that they cancelled out to provide the vectors shown in FIG. 4 in some embodiments. In some embodiments, the entire antenna systems 100 and 300 are provided with diametrically opposed pairs of antenna elements that provide parasitic cross-polarization as a function of phi (angular position) and radius as shown in FIG. 4. The pairs of the elements 332a-h and 334a-h cancel out parasitic cross-polarization and each pair collectively functions as rotated DLP cross-dipoles within a circular array of environment for a given radius. Each concentric ring used in the antenna system 100 or 300 can have the same effect. The non orthogonal characteristics of the antenna elements 332a-h and 334a-h are compensated by polarization synthesis to achieve dual orthogonal linear polarization in some embodiments.

The right-hand and left-hand circular polarization (RHCP/LHCP) for the antenna systems 100 and 300 (FIGS. 1 and 2) is achieved with an ultra-wideband 90° phase shift between the dipole elements (e.g., dipole element 232 and 234 or 332a-h and 334a-h) within the pair (e.g., the antenna element 112) in some embodiments. The polarization rotation of each of the pairs of dipole elements can be configured a priori to provide relatively true dual orthogonal linear polarization pairs. For example, the pair of antenna elements 232 and 234 can be rotated by electronic adjustment to have vertical and horizontal polarization orientations. Polarization synthesis networks (PSN) at each pair can be used to generate arbitrary polarization at the radiating element and phase center alignment of the pairs of dipole element 232 and 234 or 332a-h and 334a-h as discussed below in some embodiments.

Figure 5:
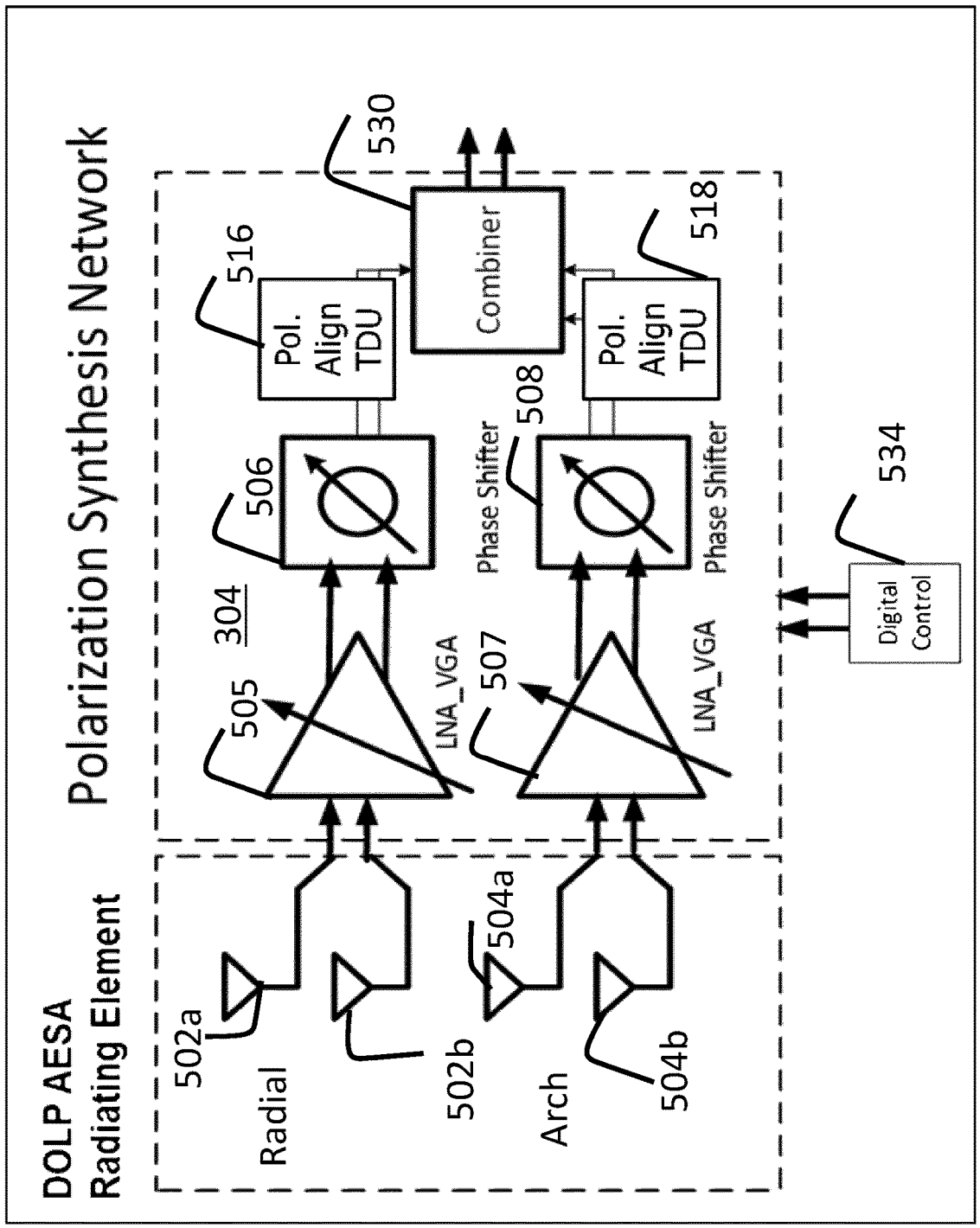
FIG. 5 is an electrical schematic drawing of a polarization synthesis network for the antenna elements for the antenna arrays illustrated in FIGS. 1 and 2 according to exemplary aspects of the inventive concepts disclosed herein.

With reference to FIG. 5, a polarization synthesis network 304 is utilized with the array 110 or 310 and is coupled to antenna elements 502a and 502b and 504a and 504b which represent differential inputs or outputs for antenna elements 332a and 334a (FIG. 4), respectively. The antenna elements 502a-b and 504a-b can be single ended input port elements in some embodiments. The polarization synthesis network 304 is similarly coupled to the antenna elements 332b-h and the antenna elements 334b-h (FIG. 4). The polarization synthesis network 304 includes a variable gain amplifier 505, a variable gain amplifier 507, a phase shifter 506, a phase shifter 508, a polarization alignment time delay unit 516, a polarization alignment time delay unit 518, and a combiner 530. The polarization synthesis network 304 can be provided in the feed for the antenna arrays 110 and 310 in some embodiments. In some embodiments, the polarization alignment time delay unit 516 and the polarization alignment time delay unit 518 are optional. In some embodiments, the polarization synthesis network 304 uses the techniques described in U.S. application Ser. No. 16/146,349, filed on Sep. 28, 2018.

A digital control circuit 534 provides control signals to the variable gain amplifier 505, variable gain amplifier 508, phase shifter 506, and phase shifter 508 to provide appropriate adjustment to the polarization associated with the antenna elements 502 a-b and 504a-b. The combiner 530 combines the signals from the polarization alignment time delay unit 516 and a polarization alignment time delay unit 518 associated with the signals from the pair of elements 502a-b and the pair of the antenna elements 504a-b. Arbitrary adjustments as well as adjustments to provide horizontally and vertically polarized signals at the combiner 530 can be achieved. Elliptical polarization, circular polarization and orthogonal polarization can be provided using the polarization synthesis network 304 in some embodiments.

The variable gain amplifiers 505 and 507 respectively provide selected amplification for the signals of the antenna elements 502a-b and the signals of the antenna elements 504*a-b*. The phase shifters 506 and 508, respectively, provide selected phase shifting for the signals of the antenna elements 502*a-b* and the signals of the antenna elements 504*a-b*. The polarization alignment time delay unit 516 and the polarization alignment time delay unit 518 respectively provide selected time delays for the signals of the antenna elements 502*a-b* and the signals of the antenna elements 334*a-b*. The polarization alignment time delay unit 516 and the polarization alignment time delay unit 518 allow adjustment (e.g., coarse over 360 degrees or fine) of phase shift to be made for the signals of the antenna elements 502*a-b* and the signals of the antenna elements 504*a-b* in some embodiments. In some embodiments, the polarization alignment time delay unit 516 and the polarization alignment time delay unit 518 provide phase center adjustment to provide aligned phase centers for the antenna elements 502*a-b* and the signals of the antenna elements 504*a-b*.

The digital control circuit 534 provides control signals to the variable gain amplifier 507, variable gain amplifier 505, phase shifter 506, phase shifter 508, polarization alignment time delay unit 516, and the polarization alignment time delay unit 518 to make the adjustments in accordance with the geometry associated with the layout of the pairs of the antenna elements 332*a-h* and 334*a-h* (FIG. 4) to provide orthogonally polarized signals in some embodiments. The digital control circuit 534 configures the polarization synthesis network 304 coupled to provide a dual orthogonal linear pair response for non-orthogonal dipole pairs of the array 110 or 310 in some embodiments. The digital control circuit 534 provides control signals for the polarization alignment time delay unit 516 and the polarization alignment time delay unit 518 according to phase center time delay processing to align the phase centers in some embodiments. The techniques described in U.S. patent application Ser. No. 15/955,030, entitled, "Systems and Methods for Phase-Coincidental Dual Polarized Wideband Antenna Arrays," incorporated herein by reference in its entirety, "can be utilized to provide phase coincidence in some embodiments. The control signals can be provided as a function of beam steering angle and frequency.

It will be appreciated that the various ESAs described herein, including the antenna system 100, may include varying arrangements of antennas (e.g., two-by-two; three-by-four; the second band may include multiple adjacent arrays. In some embodiments, providing the array of antennas includes providing a first circular array corresponding to the first design frequency and a second circular array corresponding to the second design frequency. At least a subset of antennas of the second circular array surrounds the first circular array. In some embodiments, the arrays of antennas are provided to form a three-dimensional array, which can be made conformal to a three-dimensional surface, such as a surface of an airborne platform.

The construction and arrangement of the systems and methods as shown in the various exemplary embodiments are illustrative only. Other numbers or types of antenna elements, other polarization configurations and other numbers or types dipole elements can be used. Although only a number of embodiments have been described in detail in this disclosure, many modifications are possible (e.g., variations in sizes, dimensions, structures, shapes and proportions of the various elements, values of parameters, orientations, etc.). For example, the position of elements may be reversed, flipped, or otherwise varied and the nature or number of discrete elements or positions may be altered or varied. Accordingly, all such modifications are included within the scope of the inventive concepts disclosed herein. The order or sequence of any operational flow or method operations may be varied or re-sequenced according to alternative embodiments. Other substitutions, modifications, changes, and omissions may be made in the design, operating conditions and arrangement of the exemplary embodiments without departing from the scope of the inventive concepts disclosed herein.

What is claimed is:

1. An antenna array, comprising:
a substrate having a surface;
a plurality of first members and second members, the second members being arranged about a first circumference about a center point on the surface of the substrate, the first members extending radially with respect to the center point, the second members being curved; and
a plurality of third members and fourth members arranged, the fourth members being arranged about a second circumference about the center point on the surface of the substrate, wherein the first circumference is smaller than the second circumference, the third members extending radially with respect to the center point, the fourth members being curved.

2. The antenna array of claim 1, wherein the second members have a radius of curvature that equal to a radius associated with the first circumference and the fourth members have a radius of curvature equal to a radius associated with the second circumference.

3. The antenna array of claim 2, wherein the first members and second members are smaller than the third members and the fourth members, wherein the first members and the second members are sized for a first resonance frequency and the third members and the fourth members are sized for a second resonance frequency, wherein the first resonance frequency is less than the second resonance frequency.

4. The antenna array of claim 1, wherein the substrate is a printed circuit board substrate.

5. The antenna array of claim 1, further comprising
a first capacitance region between a first end of a first member of the first members and a second end of a second member of the second members; and
a second capacitance region between a third end of a third member of the third members and a fourth end of the second member.

6. The antenna array of claim 5, wherein the first capacitance region compensates for length differences between the first members and the second members, and the second capacitance region compensates for length differences between the third members and the fourth members.

7. The antenna array of claim 1, wherein the first members and the second members are disposed in matching pairs at locations opposite from each other, wherein the first members and the second members are non-orthogonal dipole pairs.

8. The antenna array of claim 7, further comprising:
a polarization synthesis network coupled to the first members and the second members and configured to provide a dual orthogonal linear pair response for the non-orthogonal dipole pairs.

9. The antenna array of claim 1, further comprising:
a polarization synthesis network coupled to the first members and the second members, wherein the first members and the second members are non-orthogonal dipole pairs, wherein the polarization synthesis network is configured to provide an arbitrary polarization response for the non-orthogonal dipole pairs.

10. The antenna array of claim 1, further comprising:
a plurality of fifth members and sixth members, the sixth members arranged about a third circumference about the center point on the surface, wherein the third circumference is smaller than the first circumference, wherein the distance from the second circumference to the first circumference is greater than the distance between the first circumference and the third circumference, wherein the fifth members and the sixth members are smaller in area than the first members and the second members, and the third members and the fourth members are larger in area than the first members and the second members, the fifth members extending radially with respect to the center point, the sixth members being curved along the third circumference.

11. An antenna system comprising:
a printed circuit board comprising printed circuit board elements comprised of first arched elements circumferentially disposed on a surface of the printed circuit board at diametrically opposite locations and second linear elements disposed radially at diametrically opposite locations; and
a polarization synthesis network coupled to the printed circuit board elements, wherein the polarization synthesis network is configured to compensate for non-orthogonal polarization associated with a pair comprising one of the first arched elements and one of the second linear elements.

12. The antenna system of claim 11, wherein the first arched elements have a radius if curvature associated a first circumference and are disposed about the first circumference.

13. The antenna system of claim 11, wherein the polarization synthesis network is coupled to each of the printed circuit board elements and is configured to compensate for non-orthogonal polarization associated with each pair comprising one of the first arched elements and one of the linear elements.

14. The antenna system of claim 11, wherein the polarization synthesis network is coupled to each of the printed circuit board elements and is configured to provide a selected polarization for each pair comprising one of the first arched elements and one of the linear elements.

15. The antenna system of claim 11, wherein the first arched elements are disposed in a first set along a first circumference, in a second set along a second circumference, and in a third set along a third circumference, and the second linear elements are disposed in a fourth set between a center point and the first circumference, a fifth set between the first circumference and the third circumference, and a sixth set between the second circumference and the third circumference, wherein the first arched elements in the first set are smaller than the first arched elements in the second set and the second linear elements in the fourth set are smaller than the second linear elements in the second set, wherein the first circumference has a smaller radius than the second circumference.

16. A method of manufacturing an antenna array, the method comprising:
providing a substrate;
providing at least four first elements at locations along a circumference on the substrate;
providing at least four second elements radially with respect to the circumference, wherein the first elements are curved and the second elements are linear, wherein the first elements and the second elements are disposed such that a pair of a first element of the first elements and a second element of the second elements effectively have non-orthogonal linear polarization due to parasitic cross polarization cancellation; and
providing a polarization synthesis network coupled to the pair to provide arbitrary polarization.

17. The method of claim 16, further comprising:
providing at least four more of the first elements at locations along another circumference on the substrate and at least four more of the second elements radially with respect to the circumference.

18. The method of claim 17, wherein the first elements are capacitively coupled with radially neighboring second elements and are capacitively coupled with neighboring first elements on the same circumference.

19. The method of claim 18, wherein the first elements and the second elements are configured as dual linear dipoles electrically functioning as rotated DOLP cross dipoles within a circular array arrangement and wherein the antenna array is an ultra-ultra-wide band (UUWB) Wavelength Scaled Array (WSA) Tightly Coupled Dipole Array (TCDA) Active Electronically Scanned Array (AESA) Aperture.

20. The method of claim 16, wherein the substrate is comprised of a plurality of circuit boards, the method further comprising:
joining the circuit boards.

* * * * *